United States Patent [19]
Yabe

[11] Patent Number: 5,363,336
[45] Date of Patent: Nov. 8, 1994

[54] SEMICONDUCTOR MEMORY DEVICE CONTROLLING THE SUPPLY VOLTAGE ON BIT LINES

[75] Inventor: Tomoaki Yabe, Tokyo, Japan

[73] Assignee: Kabushiki Kaisha Toshiba, Kawasaki, Japan

[21] Appl. No.: 68,535

[22] Filed: May 27, 1993

[30] Foreign Application Priority Data

May 27, 1992 [JP] Japan ................... 4-135192

[51] Int. Cl.⁵ .............................................. G11C 7/00
[52] U.S. Cl. ................... 365/226; 365/189.09; 365/228; 327/540
[58] Field of Search ................... 365/189.09, 226, 227, 365/228; 307/296.6

[56] References Cited

U.S. PATENT DOCUMENTS 5,046,052  9/1991  Miyaji et al. .................. 365/228
5,075,891  12/1991  Yan et al. ..................... 365/189.09
5,229,963  7/1993  Ohtsuka et al. ................ 365/189.09

Primary Examiner—Eugene R. LaRoche
Assistant Examiner—Christopher R. Glembocki
Attorney, Agent, or Firm—Spensley Horn Jubas & Lubitz

[57] ABSTRACT

A semiconductor memory device comprises a plurality of memory cells arrayed in matrix and each connected to a word line and a pair of bit lines for supplying a power supply voltage. A bit line load is connected to the pair of bit lines to control a current flowing through a memory cell by the power supply voltage. The semiconductor memory device also comprises a control circuit, connected to the bit line load, for detecting a variation in the power supply voltage, outputting a control signal corresponding to a value of the power supply voltage the variation of which is detected, and controlling activation/inactivation of the bit line load by changing a resistance thereof.

6 Claims, 4 Drawing Sheets

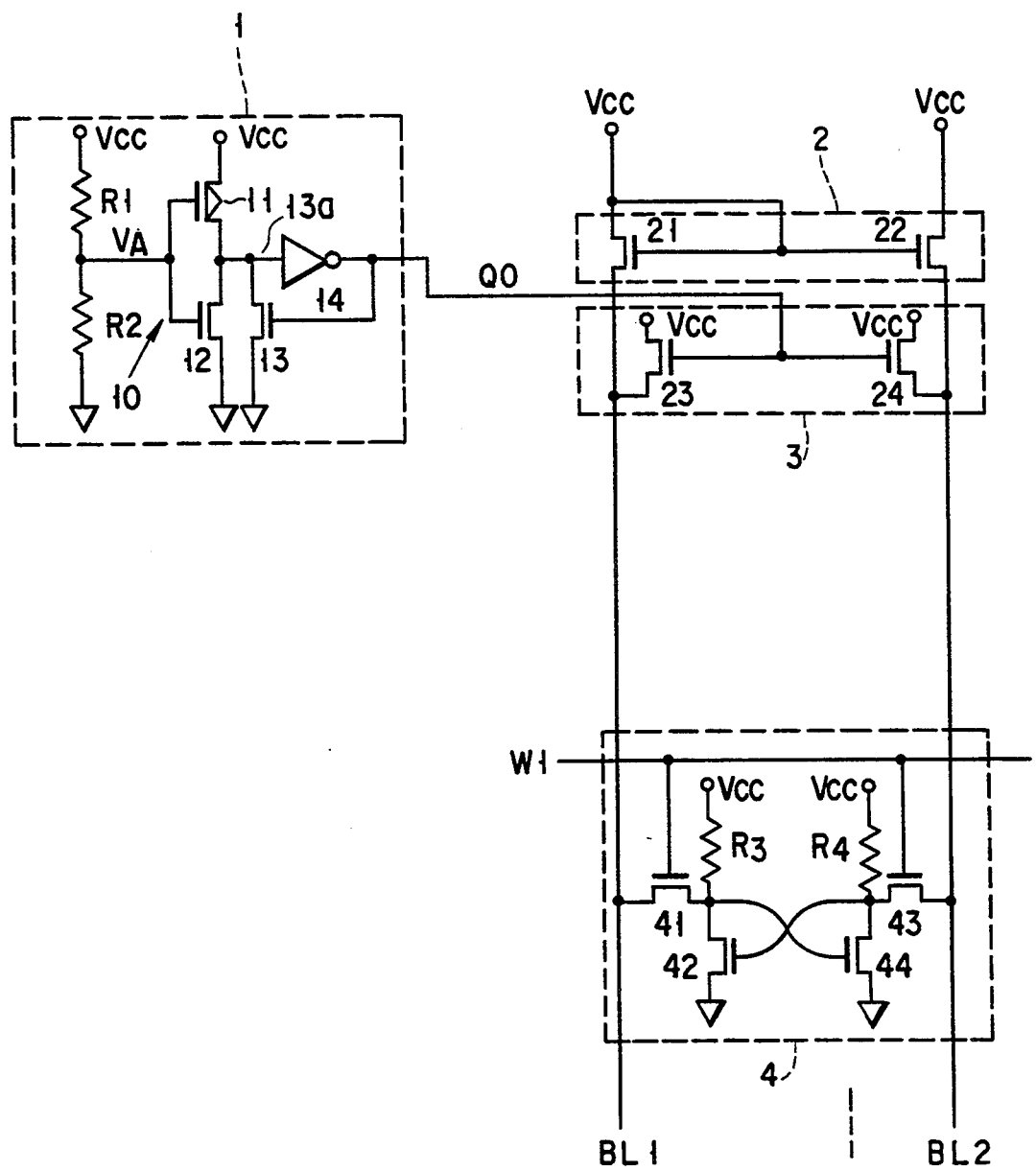
F I G. 3

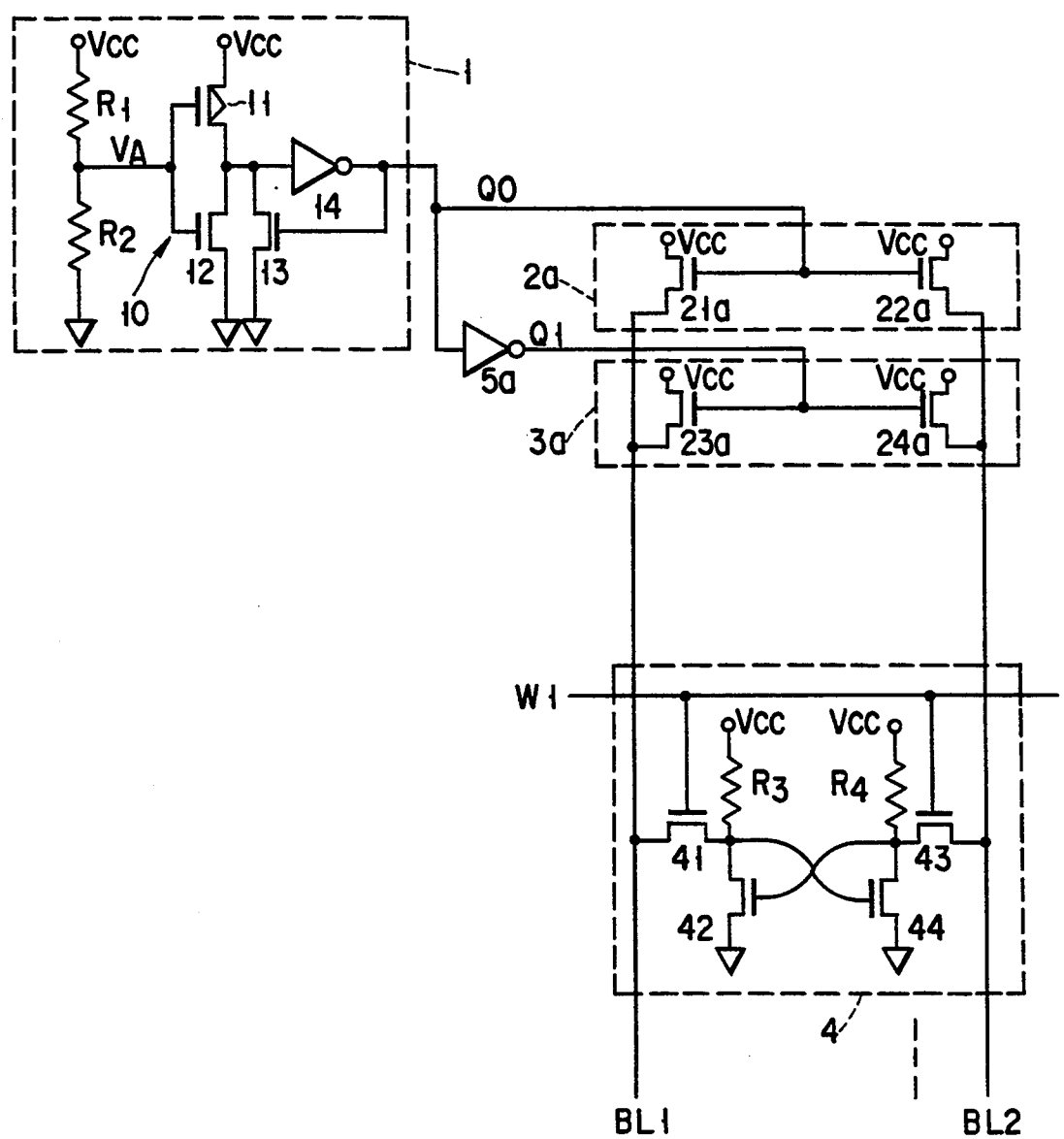
F I G. 4

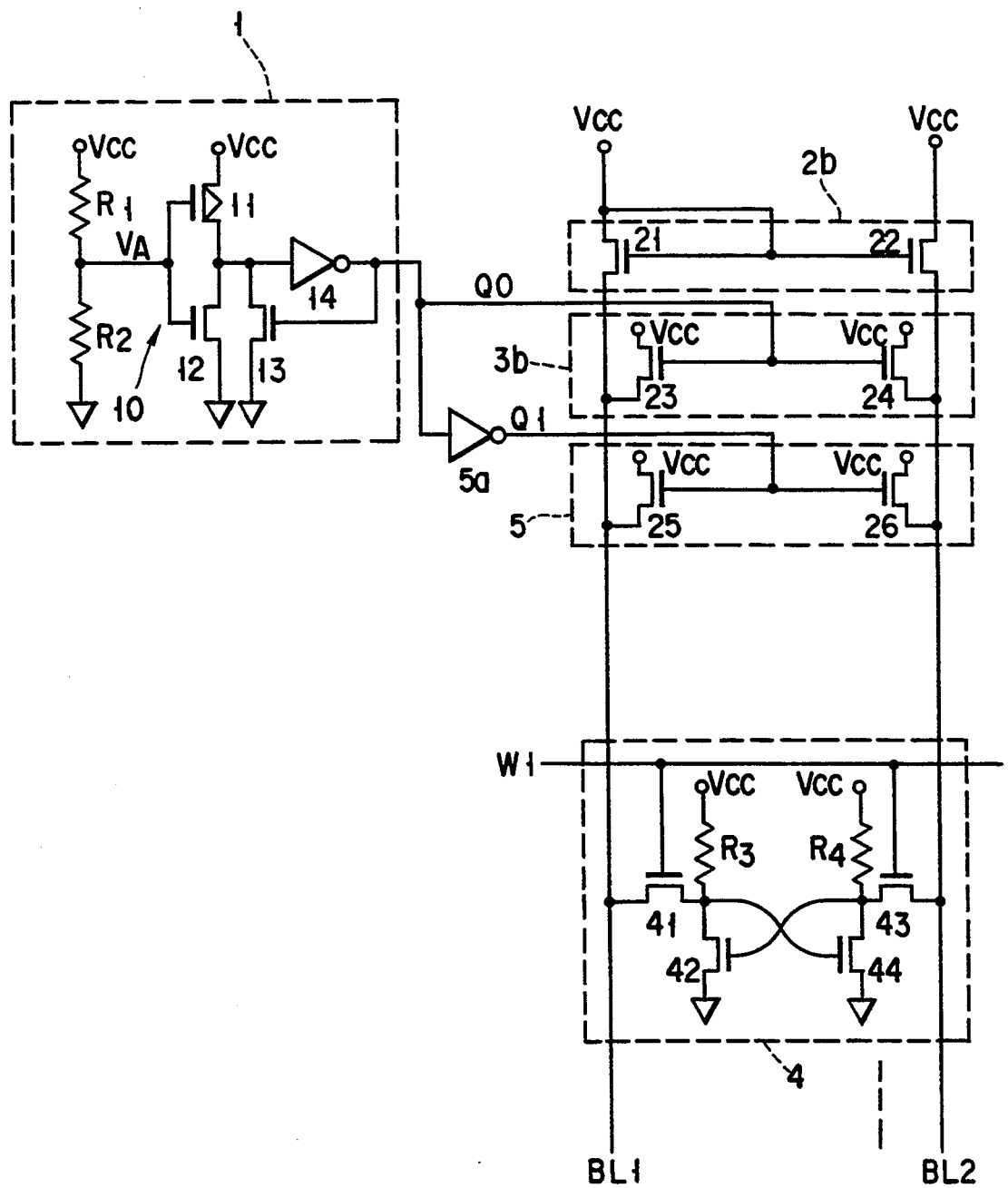
F I G. 5

SEMICONDUCTOR MEMORY DEVICE CONTROLLING THE SUPPLY VOLTAGE ON BIT LINES

BACKGROUND OF THE INVENTION

1. Field of the Invention

The present invention relates to a semiconductor memory device which can be operated stably within a wide power supply voltage range and, more specifically, to a semiconductor memory device used in a static random access memory for stabilizing the operation of the memory cells in accordance with variations in the power supply voltage.

2. Description of the Related Art

The structure of a conventional semiconductor memory (static random access memory) will now be described, with reference to FIG. 1.

The semiconductor memory shown in FIG. 1 comprises a bit line load 50 and a memory cell 60 both connected to bit lines BL3 and BL4, as disclosed in *IEEE Journal of Solid-State Circuits*, Vol. 25, No. 5, October, 1990, pp. 1057–1062. The bit line load 50 includes N-channel MOSFETs 51 and 52. A power supply voltage VCC is applied to one end of each of the current paths of the N-channel MOSFETS and a gate electrode thereof, the other ends of the current paths of the N-channel MOSFETs being connected to the bit lines BL3 and BL4, respectively. The memory cell 60 includes transfer transistors 61 and 62, N-channel MOSFETs 63 and 64, and resistors R5 and R6. A plurality of memory cells corresponding to the memory cell 60 are connected to the bit lines BL3 and BL4, though this is not shown in FIG. 1.

The respective gate electrodes of the transfer transistors 61 and 62 are connected to a word line W2, one end of the current path of the transfer transistor 61 is connected to the bit line BL3, and one end of the current path of the transfer transistor 62 is connected to the bit line BL4. The other end of the current path of the transfer transistor 61 is connected to the gate electrode of the N-channel MOSFET 64, and the other end of the current path of the transfer transistor 62 is connected to the gate electrode of the N-channel MOSFET 63.

One end of the current path of the N-channel MOSFET 63 is connected to one end of the resistor R5, the other end of the current path of the transfer transistor 61, and the gate electrode of the N-channel MOSFET 64. The other end of the current path of the N-channel MOSFET 63 is grounded. On the other hand, one end of the current path of the N-channel MOSFET 64 is connected to one end of the resistor R6, the other end of the current path of the transfer transistor 62, and the gate electrode of the N-channel MOSFET 63. The other end of the current path of the N-channel MOSFET 64 is grounded. A power supply voltage VCC is applied to the other end of each of the resistors R5 and R6.

An operation of the conventional semiconductor memory will now be described.

The word line W2 and bit lines BL3 and BL4 are selected to read data out of the memory cell 60. When the word line W2 is selected, a high-level signal is supplied to the gate electrodes of the transfer transistors 61 and 62, and the transfer transistor 61 is turned on, with the result that data is supplied to the bit lines BL3 and BL4 from the memory cell 60.

If, when data is read out from the memory cell 60, the power supply voltage VCC is higher than a reference voltage, the potentials at the bit lines BL3 and BL4 are increased, as is the potential (power supply voltage) at the gate electrode of the transfer transistor 61, thereby increasing the amount of cell current flowing through the memory cell 60. When the amount of cell current is large, the voltage drops, owing to a parasitic resistance in the memory cell 60, and the level of output data becomes unsteady, with the result that the operation of the memory cell 60 becomes unstable. If the ratio of driving force $\beta$ of the N-channel MOSFET 63 to driving force $\beta$ of the transfer transistor 61 is increased, the memory cell can be operated stably when the power supply voltage is high. However, this method has a drawback in that the memory cell increases in size as the driving force ratio increases. On the other hand, the amount of cell current can be suppressed by setting the impedance of the bit line load 50 in advance. However, this method has a drawback in that the amplitude of the voltage of the bit line is increased and the access speed is decreased.

In the conventional semiconductor memory described above, the bit line load is controlled by the product (WE×CS) of a WRITE signal (WE) and a chip selecting signal (CS), but is not controlled in accordance with a variation in the power supply voltage. A circuit for detecting such a variation is known from *IEEE Journal of Solid-State Circuits*, Vol. 25, No. 5, October, 1990, pp. 1082–1092. According to this journal, when the power supply voltage is higher than a predetermined threshold value, the output of the sensor becomes high. On the other hand, when the power supply voltage is lower than the threshold value, the output becomes low. However, in the conventional semiconductor memory, the impedance of the bit line load connected to the memory cell is not controlled based on a result obtained by detecting a variation in the power supply voltage in order that the memory cell can operate stably.

SUMMARY OF THE INVENTION

The present invention has been made in consideration of the above situation, and its object is to provide a semiconductor memory device capable of stabilizing an operation of the memory cells in accordance with variations in the power supply voltage.

To attain the above object, a semiconductor memory device according to the present invention, comprises:

a plurality of memory cells arrayed in matrix and each connected to a word line and a pair of bit lines for supplying power supply voltages, respectively;

a plurality of bit line loads, connected to the pair of bit lines, for controlling a current flowing to the plurality of memory cells through the pair of bit lines by the respective power supply voltages; and control means, connected in common to the plurality of bit line loads, for performing control of activation-/inactivation of said plurality of bit line loads by changing resistance of said plurality of bit line loads when a variation in the power supply voltage is detected and a control signal corresponding to a value of the power supply voltage the variation of which is detected is output.

With the structure of the semiconductor memory device described above, since the activation of a bit line load is controlled by detecting a variation in the power supply voltage, an operation of the memory cells can be controlled stably in accordance with the detected variation.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view showing circuit arrangements of bit line loads of one of memory cells in the semiconductor memory device shown in FIG. 2 and that of a control means for controlling activation of the bit line loads, and showing a relationship in connection between the bit line loads and the control means;

FIG. 4 is a view showing a semiconductor memory device according to another embodiment of the present invention, which includes bit line loads having different circuit arrangements than those of the bit line loads shown in FIG. 3; and FIG. 5 is a view showing a semiconductor memory device according to still another embodiment of the present invention, which includes bit line loads having different circuit arrangements than those of the bit line loads shown in FIGS. 3 and 4.

DETAILED DESCRIPTION OF THE PREFERRED EMBODIMENTS

A semiconductor memory device according to an embodiment of the present invention will now be described, with reference to the accompanying drawings.

Figure 1:
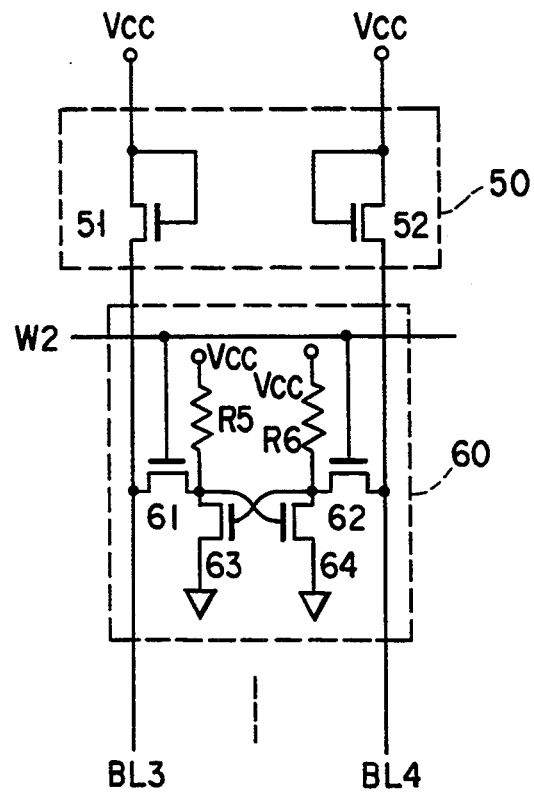
FIG. 1 is a view showing a circuit arrangement of a conventional semiconductor memory device.
Figure 2:
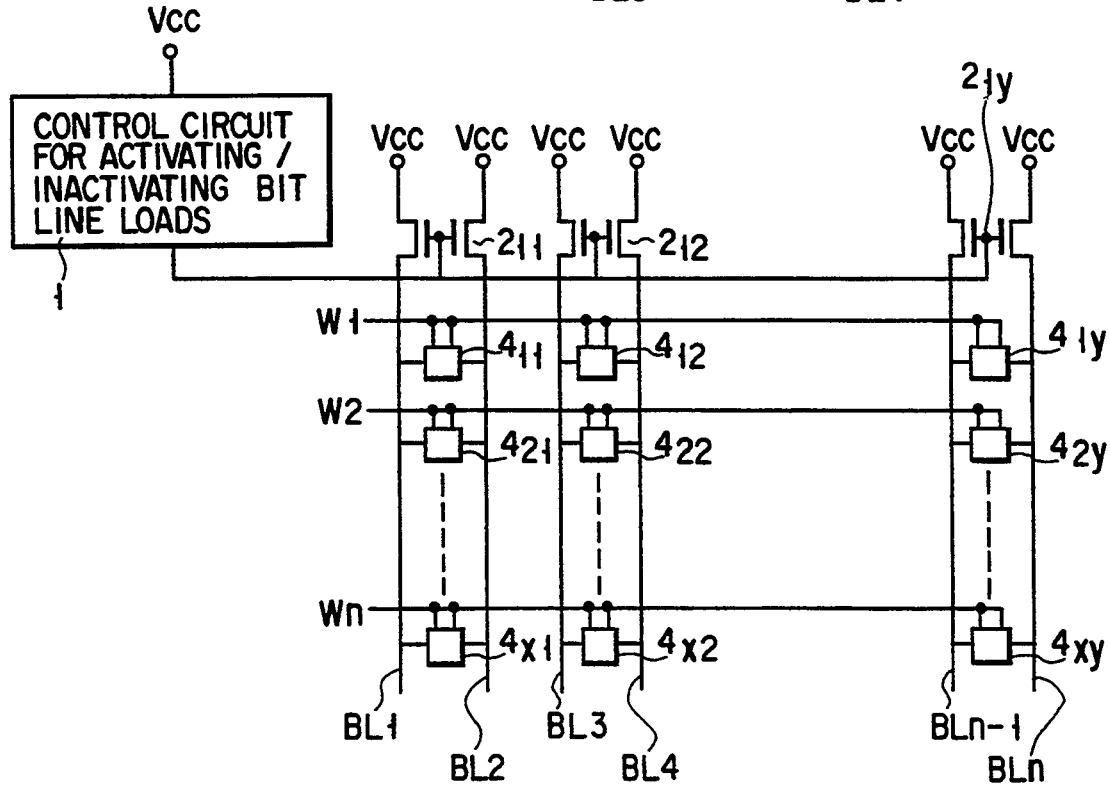
FIG. 2 is a view showing the entire circuit arrangement of a semiconductor memory device according to an embodiment of the present invention.

As shown in FIG. 2, a plurality of memory cells $4_{11}$, $4_{12}$, ..., $4_{1y}$, $4_{21}$, $4_{22}$, ..., $4_{2y}$, $4_{x1}$, $4_{x2}$, ..., $4_{xy}$ are arrayed in matrix, the memory cells on the same row are connected to each of word lines W1, W2 ..., Wn, and the memory cells on the same column are connected to each pair of bit lines BL1 and BL2; BL3 and BL4; ... ; BLn-1 and BLn. The pairs of bit lines are connected to bit line loads $2_{11}$, $2_{12}$, ..., $2_{1y}$, respectively, and power supply voltages Vcc are applied to the memory cells through the bit line loads.

A control circuit 1 for activating/inactivating the bit line loads is connected to the bit line loads. The control circuit 1 is also connected to power supplies Vcc to detect a variation in power supply voltage and supply a control signal corresponding to the variation to the bit line loads, thereby activating/inactivating the bit line loads. The current flowing through the memory cells is thus controlled, with the result that the memory cells can be operated stably.

FIG. 3 shows a memory cell 4 which is one extracted from the memory cells arrayed in matrix as shown in FIG. 2, bit line loads 2 and 3, and control circuit 1 and shows a relationship in connection between the memory cell 4, first and second bit line loads 2 and 3, and control circuit 1.

The control circuit 1 includes resistors R1 and R2, a P-channel MOSFET 11, N-channel MOSFETs 12 and 13, and an inverter 14 and detects whether a power supply voltage VCC supplied to the memory cell 4 is higher than a reference voltage V0, which will be described later. The driving force of the N-channel MOSFET 12 is considerably lower than that of the P-channel MOSFET 11.

A power supply voltage VCC is applied to one end of the resistor R1, a connection point between the other end of the resistor R1 and one end of the resistor R2 is connected to an input terminal of a CMOS circuit 10 constituted by the P- and N-channel MOSFETs 11 and 12, and the other end of the resistor R2 is grounded. A power supply voltage VCC is applied to one end of the current path of the P-channel MOSFET 11, a connection point (an output terminal of the CMOS circuit 10) between the other end of the current path of the P-channel MOSFET 11 and one end of the current path of the N-channel MOSFET 12 is connected to one end of the current path of the N-channel MOSFET 13 and an input terminal of the inverter 14, and the other end of the current path of the N-channel MOSFET 12 is grounded. The other end of the current path of the N-channel MOSFET 13 is also grounded. An output terminal of the inverter 14 is connected to a gate electrode of the N-channel MOSFET 13. An output signal of the inverter 14 serves as a control signal Q0 of the control circuit 1.

The N-channel MOSFET 13 is turned on when the gate electrode receives a high-level output signal from the inverter 14. Thus, the potential of a node 13a stably remains low in level.

The first bit line load 2 includes N-channel MOSFETs 21 and 22, and the second bit line load 3 includes N-channel MOSFETs 23 and 24. A power supply voltage VCC is applied to both one end of the current path and a gate electrode of each of the N-channel MOSFETs 21 and 22. The other end of the current path of the N-channel MOSFET 21 is connected to one end of the current path of the N-channel MOSFET 23, and the other end of the current path of the N-channel MOSFET 22 is connected to one end of the current path of the N-channel MOSFET 24. These ends of the current paths of the N-channel MOSFETs 23 and 24 are connected to the bit lines BL1 and BL2, respectively. The control signal Q0 from the control circuit 1 is supplied to each of gate electrodes of the N-channel MOSFETs 23 and 24. A power supply voltage VCC is applied to the other end of the current path of each of the N-channel MOSFETs 23 and 24. The size of each of the N-channel MOSFETs 21 and 22 is smaller than that of each of the N-channel MOSFETs 23 and 24.

The memory cell 4 includes transfer transistors (N-channel MOSFETs) 41 and 43, driving transistors 42 and 44, and resistors R3 and R4 and stores data. The gate electrodes of the transfer transistors 41 and 43 are connected to the word line W1. One end of the current path of the transfer transistor 41 is connected to the bit line BL1, and one end of the current path of the transfer transistor 43 is connected to the bit line BL2. The other end of the current path of the transfer transistor 41 is connected to the gate electrode of the driving transistor 44, and the other end of the current path of the transfer transistor 43 is connected to the gate electrode of the driving transistor 42. One end of the current path of the driving transistor 42 is connected to one end of the resistor R3, and the other end thereof is grounded. On the other hand, one end of the current path of the driving transistor 44 is connected to one end of the resistor R4 and the other end thereof is grounded. Power supply voltages VCC are applied to the other ends of the resistors R3 and R4.

A potential (divided voltage) VA at the connection point between the other end of the resistor R1 and the one end of the resistor R2 is defined by the following equations (1) to (3). Assume that the threshold voltage of the P-channel MOSFET 11 is $|Vtp|$.

$$VA = \{(R2/(R1+R2)\} \times VCC \qquad (1)$$

When the P-channel MOSFET 11 is turned on, the potential VA is expressed by:

$$VA = VCC - |Vtp| \qquad (2)$$

The following equation is extracted from the above equations (1) and (2).

$$\{R2/(R1+R2)\} \times VCC = VCC - |Vtp| \qquad (3)$$

If the power supply voltage VCC is defined as a reference voltage V0, the reference voltage is expressed by:

$$V0 = \{(R1+R2)/R1\} \times |Vtp| \qquad (4)$$

An operation of the semiconductor memory device will be described, using the reference voltage V0 expressed by the equation (4).

When VCC is higher than V0:

When the power supply voltage VCC is higher than the reference voltage V0, the P-channel MOSFET 11 is turned on, and a high-level signal is output from the output terminal of the CMOS circuit 10. The inverter 14 inverts the high-level signal and outputs a low-level control signal Q0. The output signal of the inverter 14 is supplied to the gate electrode of the N-channel MOSFET 13, and the N-channel MOSFET 13 is turned off accordingly.

When the low-level control signal Q0 is supplied to the gate electrodes of the N-channel MOSFETs 23 and 24, these MOSFETs are turned off, and the second bit line load 3 is inactivated. Since the first bit line load 2 is activated, a current flows from the first bit line load 2 to the bit lines BL1 and BL2.

As described above, when the power supply voltage VCC is higher than the reference voltage V0, the second bit line load 3 is inactivated in response to the control signal Q0 supplied from the control circuit 1, and the current flowing through the memory cell 4 is reduced, thereby stabilizing the operation of the memory cell.

When VCC is lower than V0:

When the power supply voltage VCC is lower than the reference voltage V0, the N-channel MOSFET 12 is turned on, and a low-level signal is output from the output terminal of the CMOS circuit 10. The inverter 14 inverts the low-level signal and outputs a high-level control signal Q0. The output signal of the inverter 14 is supplied to the gate electrode of the N-channel MOSFET 13, and the N-channel MOSFET 13 is turned on accordingly. Consequently, the N-channel MOSFET 13 reliably increases the potential of the node 13a to a low level.

when the high-level control signal Q0 is supplied to the gate electrodes of the N-channel MOSFETs 23 and 24, the N-channel MOSFETs 23 and 24 are turned on, and the second bit line load 3 is activated. Since the first bit line load 2 always remains in an activated state, currents flow from the first and second bit line loads 2 and 3 to the bit lines BL1 and BL2.

As described above, when the power supply voltage VCC is lower than the reference voltage V0, the second bit line load 3 is activated in response to the control signal Q0 supplied from the control circuit 1. Since the swing of potentials between the bit lines BL1 and BL2 is clamped, data is read out from the memory cell at high speed.

A semiconductor memory device according to another embodiment of the present invention will now be described with reference to FIG. 4. In FIG. 4, the same elements as those of FIG. 3 are denoted by the same reference numerals and their descriptions are omitted.

As shown in FIG. 4, first and second bit line loads 2a and 3a whose sizes differ from each other, are connected to the bit lines BL1 and BL2. The first bit line load 2a is supplied with a control signal Q0, and the second bit line load 3a is supplied with a control signal Q1 through an inverter 5a. In the semiconductor memory device shown in FIG. 4, one of the first and second bit line loads 2a and 3a is activated and the other bit line load is inactivated to control the cell current flowing through the memory cell 4, with the result that the operation of the memory cell 4 is stabilized.

More specifically, when the power supply voltage VCC is lower than the reference voltage V0, a high-level control signal Q0 from the control circuit 1 is supplied to the gate electrodes of transistors 21a and 22a of the first bit line load 2a, thus turning on the transistors 21a and 22a. If the on-resistances of the transistors 21a and 22a are set low, a predetermined cell current is caused to flow through the memory cell to read out data from the memory cell at high speed. The bit line load 3a is then inactivated by the output inverted by the inverter 5a.

When the power supply voltage VCC is higher than the reference voltage V0, a low-level control signal Q0 from the control circuit 1 is inverted by the inverter 5a, and a high-level control signal Q1 to the gate electrodes of transistors 23a and 24a of the second bit line load 3a, thereby turning on the transistors 23a and 24a. If the resistances of the transistors 23a and 24a are set high, the cell current flowing through the memory cell 4 is reduced, with the result that the operation of the memory cell is stabilized. The bit line load 2a is then inactivated by the low-level control signal Q0.

A semiconductor memory device according to still another embodiment of the present invention will now be described with reference to FIG. 5. This semiconductor memory device includes a third bit line load 5 connected to the bit lines BL1 and BL2 in addition to the first and second bit line loads shown in FIG. 3. In FIG. 5, the same elements as those of FIG. 3 are denoted by the same reference numerals and their descriptions are omitted.

The third bit line load 5 includes N-channel MOSFETs 25 and 26, and is activated or inactivated in response to a control signal Q1 which is inverted by the inverter 5a. Since the circuit arrangement shown in FIG. 5 activates a predetermined one of the bit line loads 2b, 3b, and 5 in accordance with a value of the power supply voltage VCC, the cell currents flowing through the bit lines are controlled by the bit line loads and mixed together, thereby causing the mixed current to flow to the memory cell 4 as a fine-controlled current.

More specifically, the gate electrodes of the transistors 21 and 22 of the first bit line load 2b are fixed to the power supply voltage VCC.

When the power supply voltage VCC is lower than the reference voltage V0, a high-level control signal Q0 is supplied from the control circuit 1 to the gate electrodes of the transistors 23 and 24 of the second bit line load 3b, thus turning on the transistors 23 and 24. If the resistances of the transistors 23 and 24 are set low, a predetermined amount of current is caused to flow, with the result that data can be read out from the memory cell at high speed.

When the power supply voltage VCC is higher than the reference voltage V0, a low-level control signal Q1 supplied from the control circuit 1 is inverted by the inverter 5a, and a high-level control signal Q1 is supplied to the gate electrodes of the transistors 25 and 26 of the third bit line load 5, thus turning on the transistors 25 and 26. If the resistances of the transistors 25 and 26 are set high, the cell current flowing through the memory cell 4 is decreased in amount, and the memory cell is operated stably.

In the semiconductor memory devices according to the above embodiments, the operation of the memory cell can be stabilized within a wide range of power supply voltage without increasing the area of the memory cell or decreasing the data access time when the device is operated at a low power supply voltage.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
    a plurality of memory cells arrayed in a matrix and each connected to a word line and a pair of bit lines for supplying a power supply voltage;
    control means for detecting a variation in the power supply voltage and outputting a control signal corresponding to a value of the power supply voltage;
    a first bit line load having a first N-channel MOSFET and a second N-channel MOSFET whose current paths are connected to said pair of bit lines and to respective loading power supplies, and whose gate electrodes are connected in common to one of said loading power supplies; and
    a second bit line load having a third N-channel MOSFET and a fourth N-channel MOSFET whose current paths are connected to said pair of bit lines, and whose gate electrodes are coupled to an output terminal of said control means so that said third N-channel MOSFET and said fourth N-channel MOSFET of said second bit line load receive the control signal from said control means when it is detected that the value of the power supply voltage exceeds a value of a reference voltage, thereby inactivating said second bit line load and decreasing the current flowing to said plurality of memory cells.

2. A semiconductor memory device comprising:
    a plurality of memory cells arrayed in a matrix and each connected to a word line and a pair of bit lines for supplying a power supply voltage;
    control means for detecting a variation in the power supply voltage and outputting a control signal corresponding to a value of the power supply voltage;
    a first bit line load having a first N-channel MOSFET and a second N-channel MOSFET whose current paths are connected to said pair of bit lines and to respective loading power supplies, and whose gate electrodes receive the control signal from an output terminal of said control means;
    an inverter circuit connected to the output terminal of said control means for inverting the control signal output therefrom; and
    a second bit line load having a third N-channel MOSFET and a fourth N-channel MOSFET whose current paths are connected to said pair of bit lines and whose gate electrodes are connected in common to the output terminal of said control means via said inverter circuit,
    wherein said control means is connected in common to said first and second bit line loads and wherein said control signal controls the activation/inactivation of said first and second bit line loads and changes the resistances thereof in response to the detection of a variation in the value of the power supply voltage.

3. The semiconductor memory device according to claim 2, wherein said first bit line load and said second bit line load receive a control signal corresponding to a variation in the power supply voltage from said control means, thereby activating one of said first and second bit line loads and inactivating other thereof.

4. A semiconductor memory device comprising:
    a plurality of memory cells arrayed in a matrix and each connected to a word line and a pair of bit lines for supplying a power supply voltage;
    control means for detecting a variation in the power supply voltage and outputting a control signal corresponding to a value of the power supply voltage;
    a first bit line load having a first N-channel MOSFET and a second N-channel MOSFET whose current paths are connected to said pair of bit lines connected to loading power supplies, respectively, and whose gate electrodes are connected in common to one of said loading power supplies;
    a second bit line load having a third N-channel MOSFET and a fourth N-channel MOSFET whose current paths are connected to said pair of bit lines, and whose gate electrodes are connected in common to an output terminal of said control means to activate said second bit line load in response to the control signal corresponding to the detection of a variation in the power supply voltage;
    an inverter circuit connected to the output terminal of said control means, for inverting the control signal; and
    a third bit line load having a fifth N-channel MOSFET and a sixth N-channel MOSFET whose current paths are connected to said pair of bit lines and whose gate electrodes are connected in common to the output terminal of said control means via said inverter circuit.

5. The memory device of claim 4 wherein said third bit line load is deactivated when said second bit line load is activated.

6. The memory device of claim 5 wherein said control signal switches between a first and a second value in response to the value of the power supply voltage increasing or decreasing below a reference voltage value.

* * * * *